United States Patent
Neugebauer et al.

(10) Patent No.: US 6,473,131 B1
(45) Date of Patent: Oct. 29, 2002

(54) SYSTEM AND METHOD FOR SAMPLING AN ANALOG SIGNAL LEVEL

(75) Inventors: Charles F. Neugebauer, Palo Alto; William D. Elliott, Sunnyvale; David Deckys, Santa Clara; Thomas M. Annau, San Francisco, all of CA (US)

(73) Assignee: STMicroelectronics, Inc., Carrollton, TX (US)

( * ) Notice: Subject to any disclaimer, the term of this patent is extended or adjusted under 35 U.S.C. 154(b) by 242 days.

(21) Appl. No.: 09/607,492

(22) Filed: Jun. 30, 2000

(51) Int. Cl.[7] .............................................. H03M 1/12
(52) U.S. Cl. ...................................... 348/572; 348/537
(58) Field of Search ................................ 348/572, 573, 348/625, 607, 536, 537; 341/155; H03M 1/12; H04N 5/21

(56) References Cited

U.S. PATENT DOCUMENTS 5,764,299 A * 6/1998 Jennes et al. ............... 348/572
5,936,678 A * 8/1999 Hirashima .................. 348/572

OTHER PUBLICATIONS

Hiroaki Yasuda et al., "VESA Video Signal Standard", 1999, Video Electronics Standards Association, Ver. 1.97, pp. 4–15.

"Analog Devices", 100 MSPS/140MSPS, Analog Flat Panel Interface AD9884A, Analog Devices, In., 2000, pp. 13–17.

\* cited by examiner

*Primary Examiner*—Sherrie Hsia
(74) *Attorney, Agent, or Firm*—Stephen Bongini; Lisa K. Jorgenson

(57) ABSTRACT

A system includes a signal reconstruction controller (110) electrically coupled to at least one analog-to-digital converter (ADC) (112) and to a phase adjustable clock source (108). A sampling clock signal (116) is electrically coupled from the clock source (108) to the at least one ADC (112). The at least one ADC (112) samples an electronic signal according to the sampling clock signal (116) to provide a digital representation of the electronic signal. The controller (110) samples data from the ADC (112) at different sampling points in the electronic signal and determines the edges (140) of the electronic signal and the noisy samples (142, 144) that are away from the edges (140) of the electronic signal. By finding the least noisy sample (146, 148) that is away from the edges (140) of the electronic signal the controller (110) adjusts the phase of a sampling signal clock (116) to a sampling point that is the most reliable to sample the electronic signal to provide a digital representation thereof.

12 Claims, 6 Drawing Sheets

SYSTEM AND METHOD FOR SAMPLING AN ANALOG SIGNAL LEVEL

BACKGROUND OF THE INVENTION

1. Field of the Invention

This invention relates in general to electronic digital signaling systems, and more particularly to a system and method for sampling an electronic signal to convert the electronic signal to a digital representation thereof.

2. Description of Related Art

A variety of electronic devices such as computers, monitors, flat panel displays, wireless communication devices, cellular phones, high speed two-way digital transceivers, and paging devices, to name just a few, utilize a plurality of electronic signals. These include clock signals, vertical-synch and horizontal-synch signals, spread spectrum and digital wireless communication signals, etc. A predominant trend in electronic devices is the use of digital signals. As it is well known to those of ordinary skill in the art, there are many advantages to representing electronic signals in digital signal form in many such electronic devices. However, in certain situations it is necessary to communicate electronic signals using a legacy medium requiring information in an analog format. The resulting electronic signals, after being communicated across the medium, may require correction to represent the electronic signal in a digital representation thereof.

An Analog-to-Digital converter (ADC) is typically utilized to sample an analog electronic signal at a point in time and to convert the sampled electronic signal to a digital representation thereof. The ADC, in one common configuration, typically includes a resistive ladder network electrically coupled to a plurality of comparators that are respectively referenced to a plurality of reference voltages. The ADC compares the voltage amplitude of an input signal to the plurality of reference voltages and provides an output signal that is a digital representation of the input signal at a point in time. A Digital-to-Analog Converter (DAC), on the other hand, normally converts a digital representation of an electronic signal to an analog electronic signal. Utilizing the DAC to convert a sequence of digital representations to analog representations of an electronic signal at sequential points in time can provide a continuous analog electronic signal.

In one particular example, a computer graphics controller using frame buffer data transmits a digital video signal to a DAC module to provide an analog video signal at an output of a computer graphics interface. This output video signal is utilized to drive a video monitor. The video signal is coupled to an interface of a video monitor typically via a cable. The transmission via the cable medium tends to pick up noise signals and adds different forms of distortion to the analog video signal. For example, besides distortion due to capacitive and inductive effects of the cable medium, this distortion may also include jitter from the output of the computer graphics interface. On the other side of this cable medium, when receiving the analog video signal including all the noise and distortion signals, a video interface for the video monitor couples the analog video signal to a ADC module. However the graphics controller clock is not transmitted to the video monitor. For a digital video monitor, this clock must be regenerated and the sample phase adjusted to synchronize the ADC samples with the original graphics controller digital clock period. Regrettably, conventional ADC implementations have not been very successful at removing most of the noise and distortion signals from the pure analog video signal. The resulting digital representation of the video signal may include some of the noise and distortion signals, which are particularly detrimental to the quality of the video image if the clock regeneration and phase adjustment are inaccurate.

Conventional implementations of video signal reconstruction have attempted to reconstruct a digital representation of an analog video signal as follows. An ADC module is driven with a sampling clock signal to sample points in an analog video signal to identify the leading and trailing edges of any signal transition in an analog video signal. The edges of a signal transition normally are not desirable sampling points for sampling the voltage amplitude of the particular video pixel (picture element). It is desirable to sample the signal in the flat region (between the edges) of the signal transition where the voltage level is stable and may be better determined from the sample point. Prior art methods drive the ADC to sample at a point in the signal that is just before the trailing edge of the signal, where the flat region was expected to be most likely stable. This sampling point is selected simply to avoid the leading and trailing edges. However, any clock jitter, for example, tends to defeat this sampling method because it is very difficult to select a sampling clock rate that avoids the trailing edge of the signal transition while intermittent jitter keeps moving the trailing edge of a signal transition relative to a time reference. Additionally, other sources of noise may be present during the flat region of the signal and a sample taken by the ADC during this noise signal will possibly provide a false measurement of signal level.

Unfortunately, these simplistic methods of driving the ADC to avoid the signal edges have not been very successful and the noise and distortion signals tend to pass through and be included into the digital representation of the video signal. This reduces the quality of a video image, and leads to the loss of image information, that is presented via the video monitor display to a user. The result is a lower opinion of the quality of the video monitor system and reduced commercial viability of products. This reduced quality and lost information can impact other applications as well. For example, distorted or lost information in a wireless communication signal can significantly impact or even destroy a wireless communication.

Thus, there is a need to overcome the disadvantages of the prior art as discussed above, and in particular to improve the quality of conversion of the analog electronic signal to a digital representation thereof.

DETAILED DESCRIPTION OF THE PREFERRED EMBODIMENTS

Figure 1A:
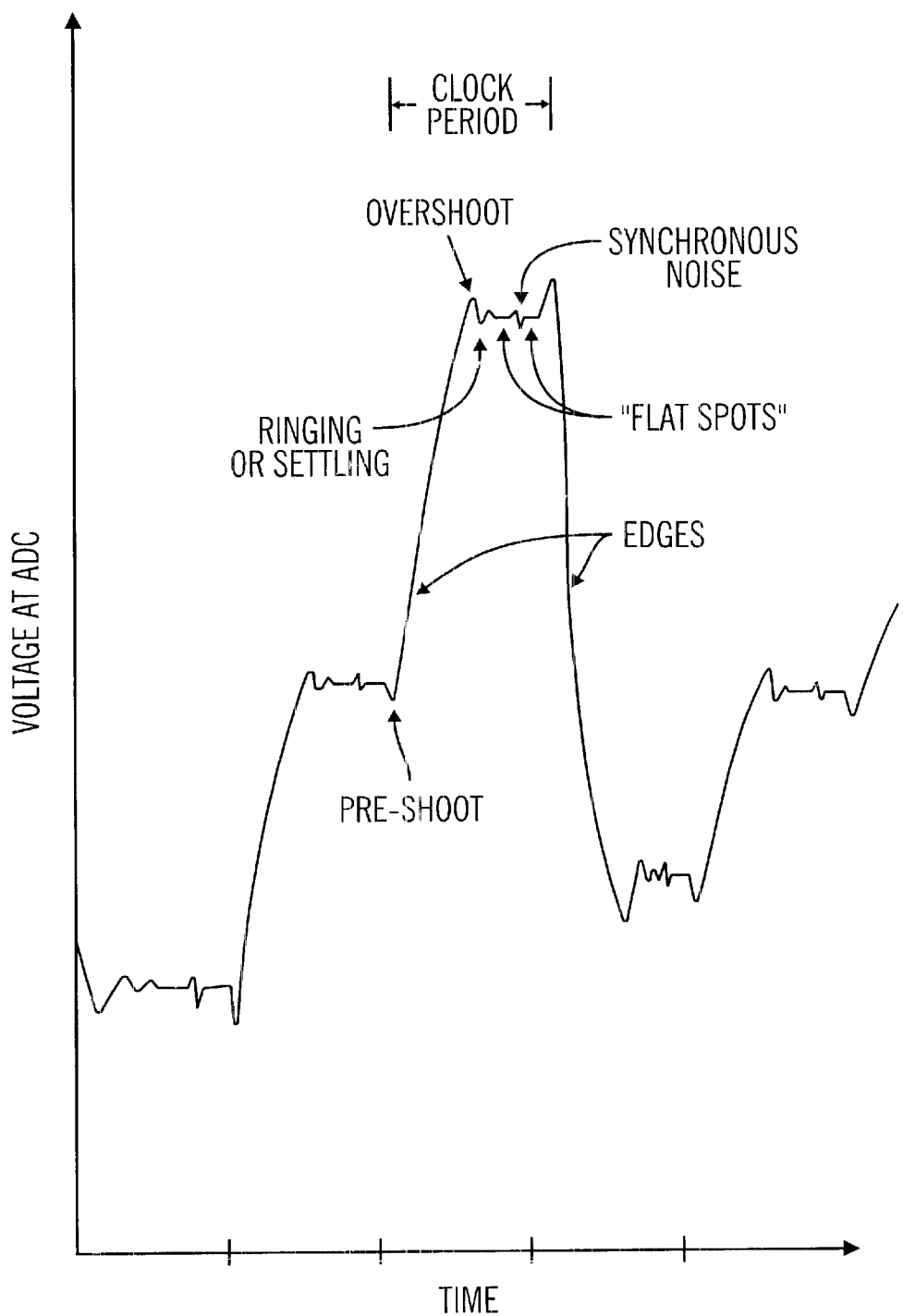
FIGS. 1A and 1B, constitute a signaling diagram illustrating voltage vs. time for an exemplary analog electronic signal and indicating sampling points for providing a digital representation of the bit electronic signal.
Figure 1B:
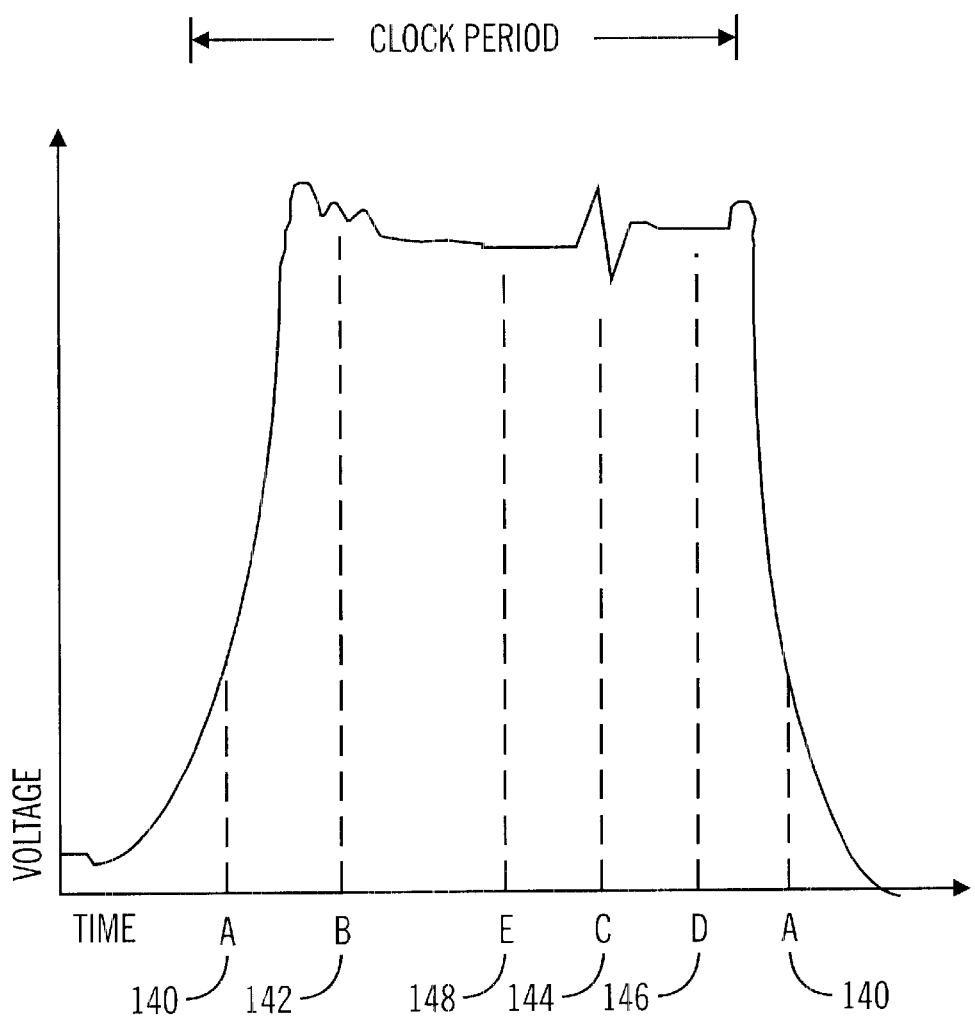

Referring to FIGS. 1A and 1B, an exemplary electronic signal representing information encoded into voltage levels is shown. FIG. 1A illustrates a large portion of the overall electronic signal, showing for example pre-shoot, overshoot, ringing or settling, synchronous noise, steep edges, and flat regions of interest. FIG. 1B focuses on a portion of the electronic signal shown in FIG. 1A about the flat regions of interest in the electronic signal. Different noise and distortion signals may be included along with the analog signal representing the bit of information. Sampling the electronic signal near either of the sharp edges, at points labeled A 140, is normally undesirable. Sampling at the edges, typically, results in poor contrast measurements from sample to sample. Further, there is likely ringing noise present toward the leading edge of a voltage sample such as shown at point labeled B 142. This noisy part of the flat region of the signal is also a poor choice for sampling the voltage level. Furthermore, there can be other synchronous noise in the signal, such as indicated by the point labeled C 144. The synchronous noise 144 in the signal can be due, for example, to other noise sources in close proximity to the sampling clock circuit, typically located in the same integrated circuit chip as the clock circuit. Because these synchronous noise signals 144 are normally present in the same phase location of each voltage level being sampled, a sampling point in this noisy portion of the flat region will usually be a poor choice for converting the sample to a digital representation of the information.

The better choices for sampling the voltage level are where the flat region of the signal is also clear of other noise signals, such as the points indicated by labels D 146 and E 148. These portions 146, 148, of the flat region of the signal lend themselves best for accurate and reliable sampling points of the information in converting the sample to a digital representation of the signal.

According to the preferred embodiments of the present invention, the phase of the sampling clock can be automatically adjusted to avoid sampling in an undesirable portion of the signal. This preferred method according to the present invention avoids sampling about the leading and trailing edges of a transitioning signal, as in conventional systems. In addition the method additionally avoids other portions of the signal that may include undesirable noise and distortion signals, 140, 142, 144. By adjusting the phase of the clock signal driving the ADC, the preferred method samples voltage levels in the more reliable portions of the flat region 146, 148, of the signal, as will be discussed in more detail below.

Figure 2:
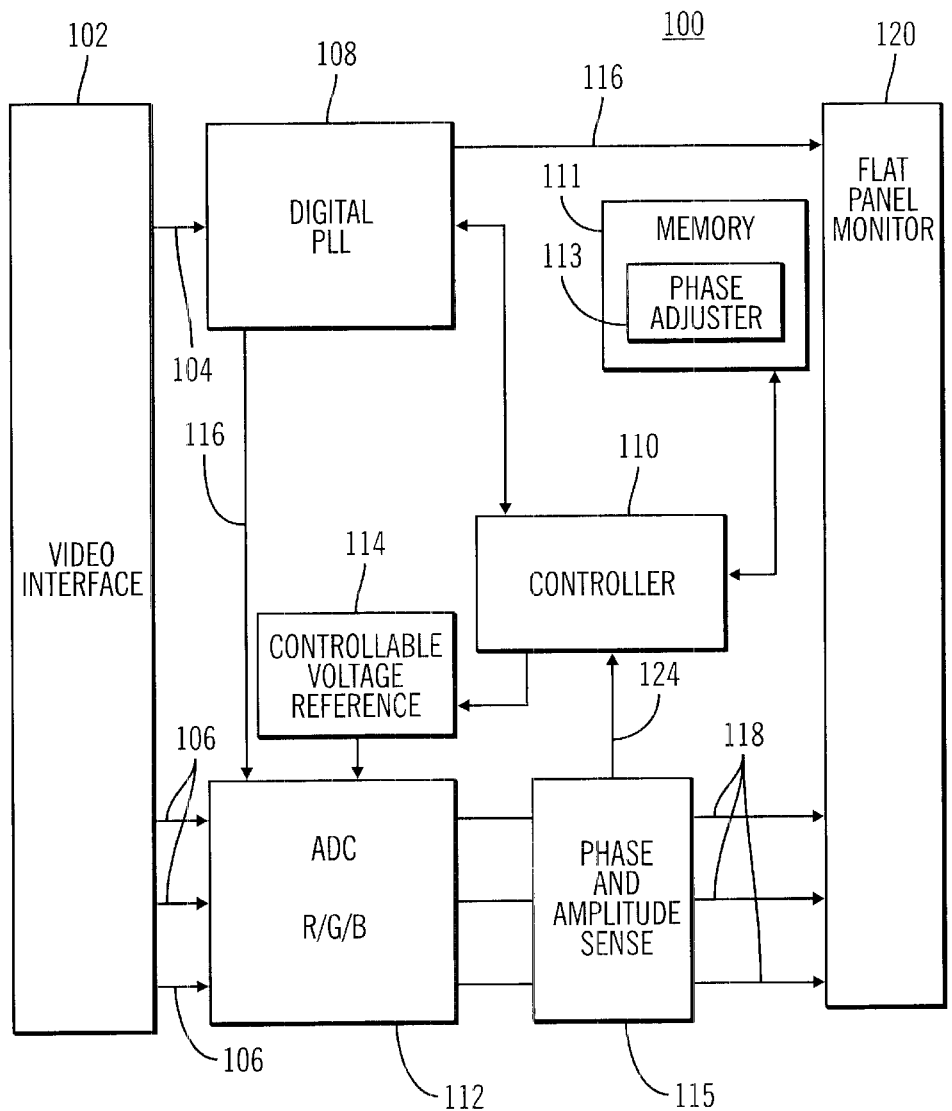
FIG. 2 is a functional block diagram of an exemplary sampling system for sampling points in an analog signal to provide a digital representation thereof, in accordance with a preferred embodiment of the present invention.

Referring to FIG. 2, an exemplary application of a preferred embodiment of the present invention focuses on a display monitor system. A graphics card inside a personal computer (PC) typically contains a graphics accelerator integrated circuit (IC) and a frame buffer. The graphics accelerator renders a frame of data in memory then converts to analog and transmits to an liquid crystal display (LCD) monitor via an analog video graphics adapter (VGA) cable. In addition to the analog data, horizontal and vertical synchronization signals are transmitted. This video signal is delivered via the cable to a video interface 102 of a flat panel monitor system 100 that includes a preferred embodiment of the present invention, as will be discussed below.

Flat panel monitors based on LCD technology are rapidly deploying into the personal computer display marketplace. Flat panel monitors offer performance advantages over conventional cathode ray tube (CRT) monitors, but the PC industry faces challenges to seamlessly integrate them into the desktop PC environment. In addition to size, weight and power advantages flat panel monitors improve image acuity. Flat panel monitors are digital devices that have the benefits of digital technology in the panel electronics as compared to analog CRT technology. Each pixel element in a flat panel monitor is micro-lithographically defined, which results in precisely defined pixel areas, unlike the fuzzy overlap of phosphor dots and the electron beam in a CRT.

Most LCD modules used in flat panel monitor applications require digital interfaces. These digital interfaces create difficulties in connecting to the analog graphics output of today's personal computer. Expensive and complex analog circuit boards have been used to convert the analog signals from the PC into the digital signals required by flat panels. In the past, users have been unable to realize all of the image quality benefits of flat panel monitors because these boards have not been able to perfectly reproduce the digital source data, as it existed in the PC.

These interface challenges and user expectations set the flat panel monitor electronics requirement. Compatibility with the PC environment first starts by properly reconstructing the clock, as described in co-pending U.S. patent application Ser. No. 09/534,932, entitled "Digital Phase Lock Loop", and co-pending U.S. patent application Ser. No. 09/535,049, entitled "System for High Precision Signal Phase Difference Measurement", both identified U.S. patent applications being commonly owned by the assignee of the present invention, and the full teachings of both identified U.S. patent applications being hereby incorporated by reference. Then, compatibility is achieved by successfully converting the analog data from the PC video signal into a digital format in the flat panel monitor, as will be discussed below.

The synchronization signals are used by the reconstruction processor to regenerate the pixel clock. The new pixel clock is used by the analog to digital converters to capture the input data in digital form. The digital signal reconstruction process consists of three steps. Sync and video timing information in the video signal present at input 104 in the video interface 102 are first used to determine the video mode of the graphics card driving the analog cable. The mode detection circuit then programs the clock recovery circuit within the digital phase lock loop (DPLL) 108 to regenerate the pixel clock. Finally the regenerated pixel clock is provided at an output 116 of the DPLL 108. This pixel clock drives the flat panel monitor 120. The clock output 116 also drives the sampling clock input of analog to digital converters (ADC) 112. This in turn transforms the input analog red, green, and blue (RGB) signals 106 to digital format at output lines 118 that are electrically coupled to the flat panel monitor 120.

During the first step inside the LCD monitor, the analog subsystem attempts to detect the video mode of the graphics IC. Based on the detected mode, the digital phase lock loop is programmed to generate a certain number of pixel clocks per horizontal sync. The analog to digital converters (ADC) 112 then produce digital outputs, using this reconstructed sampling clock.

According to a preferred embodiment of the present invention, a high precision all digital phase lock loop and a high precision digital phase comparator circuits are controllable by a reconstruction controller 110. This reconstruction controller 110 preferably comprises a microprocessor, micro-controller, or other computing device that operates according to program instructions stored in a memory 111. The memory 111 is electronically coupled to the reconstruction controller 110. The memory 111 is preferably a non-volatile memory such as EEPROM, ROM, battery backed-up RAM, or FLASH memory. Other types of non-volatile memories are also contemplated according to alternative applications of the present invention. For example, hard disk drives, floppy drives, CD-ROM drives, or pre-compiled firmware, and the like may also be suitable for use to provide instructions to the controller 110. Moreover, the controller 110 and memory 111 with program instructions can alternatively be embodied utilizing digital logic circuits, programmable logic arrays, field programmable logic arrays, and similar wired logic devices. The reconstruction controller 110, therefore, can be implemented by any combination of the above mentioned devices, technologies and their equivalents, while remaining within the scope of the present invention.

Additionally, the novel methods of the reconstruction controller 110, according to the present invention, can be applied to many different circuit implementations within the scope of the present invention. According to a preferred embodiment, the ADC 112 as well as the phase and amplitude sense measurement circuit 115 can be located in one application specific integrated circuit (ASIC) chip while the algorithm computations are done in a controller 110 that is located off-chip from the ASIC chip. Alternatively, the ADC could be external and the controller 110 could be internal to the ASIC chip. In a further alternative, the entire circuit can comprise electrically coupled circuit components that are not located in any particular ASIC chip.

With particular reference to FIG. 2, a phase adjuster 113, is embodied in this example as program instructions for operating the controller 110. The phase adjuster 113 monitors the outputs of the ADC 112, such as via the phase and amplitude sense circuits 115, and therefrom, as will be discussed below, determines the best phase of the sampling clock signal 116 to drive the ADC 112. This best phase of the sampling clock signal 116 allows the ADC 112 to sample bits of information in the video signal in the more reliable (lower noise and lower distortion) portions of the flat region 146, 148, of the bits. The phase adjuster 113 then controls the DPLL 108 to adjust the sampling clock signal 116 accordingly to drive the ADC 112 to sample the video signal in the more reliable portions of the flat region 146, 148, of the bits.

Specifically, the controller 110 is electrically coupled to the ADC 112 and to the phase and amplitude sense circuits 115. The controller 110 can provide control signals to a controllable voltage reference 114 to adjust the threshold of reference voltages of the comparators in the ADC circuits 112. The phase and amplitude sense circuits 115 comprise digital logic circuits that accumulate samples from the ADC 112 for the controller 110 to perform statistical measurement calculations of the sampled outputs from the ADC 112 according to equations that will be discussed below.

The digital phase lock loop 108 comprises a frequency synthesizer, a phase detector 224, and a loop filter 218, as discussed in U.S. patent application Ser. No. 09/534,932. It is controllable by writing a control word from the controller 110 to the DPLL 108. The control word written into the DPLL 108 will change the relative phase of the pixel clock signal at output 116. The control word written into DPLL 108 is translated into a phase shift of the ADC sampling clock relative to the video horizontal synchronization signal.

As described in detail in U.S. patent application Ser. No. 09/534,932 and in U.S. patent application Ser. No. 09/535,049, the frequency synthesizer comprises a delay measurement and configuration adjust block (Digital DLL), a phase accumulator, a non-glitching mux, a toggle flip-flop and a reference clock generator, which are all not shown in FIG. 2. The combination of these digital components creates a digital frequency synthesizer. If a thirty two bit number is provided to the phase accumulator, a high precision frequency signal is generated at the synthesized clock output. This synthesized clock output signal is provided as the pixel clock signal at output 116. The frequency synthesizer sub-system takes a 32 bit fixed precision number and generates a 50% duty cycle clock at a precise frequency up to ½ a reference clock. Alternatively, the sub-system can generate a low-duty cycle pulse train at a precise frequency up to the reference clock frequency. The controller 110 can couple a thirty two bit number to the DPLL 108 to generate a high precision frequency signal at the clock output 116.

Figure 3:
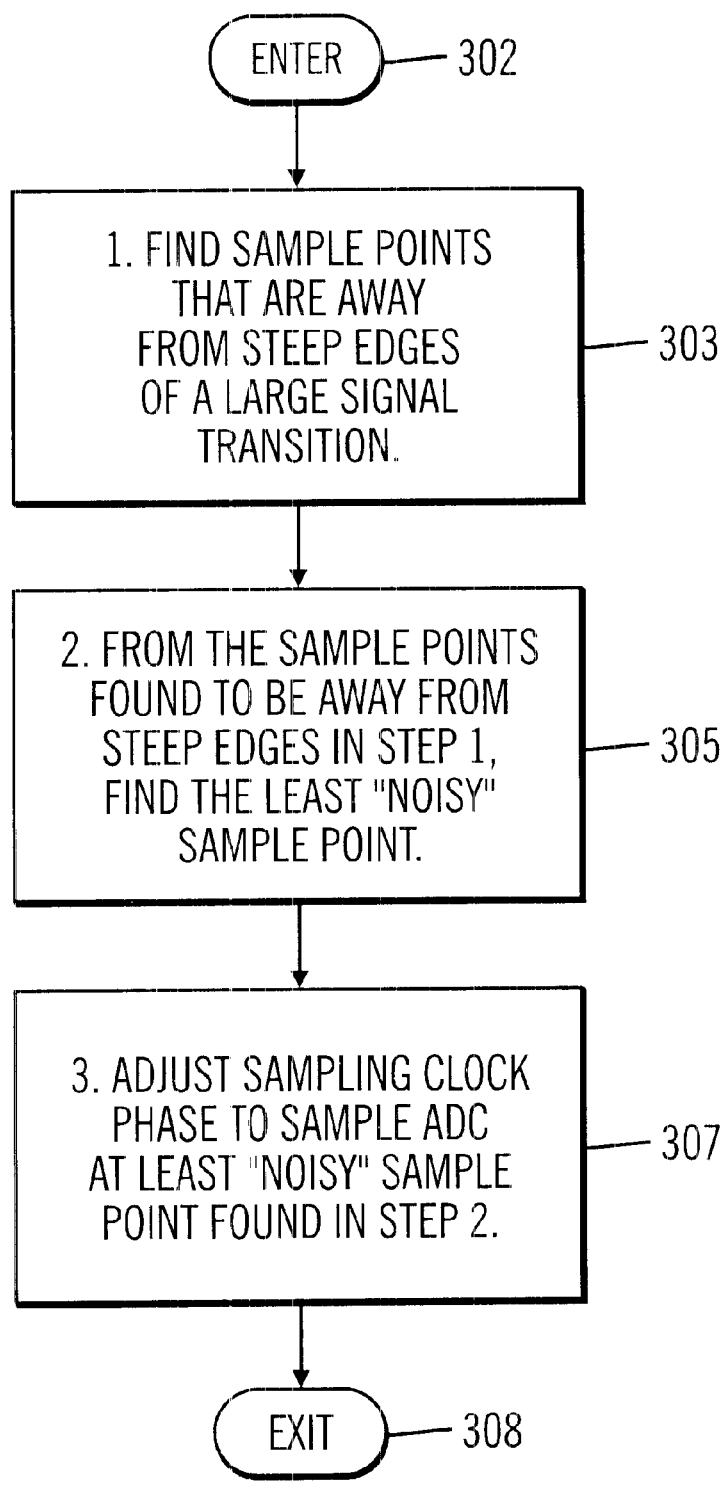
FIGS. 3, 4, 5, are exemplary flow diagrams illustrating functions of the sampling system shown in FIG. 2, according to the preferred embodiments of the present invention.
Figure 4:
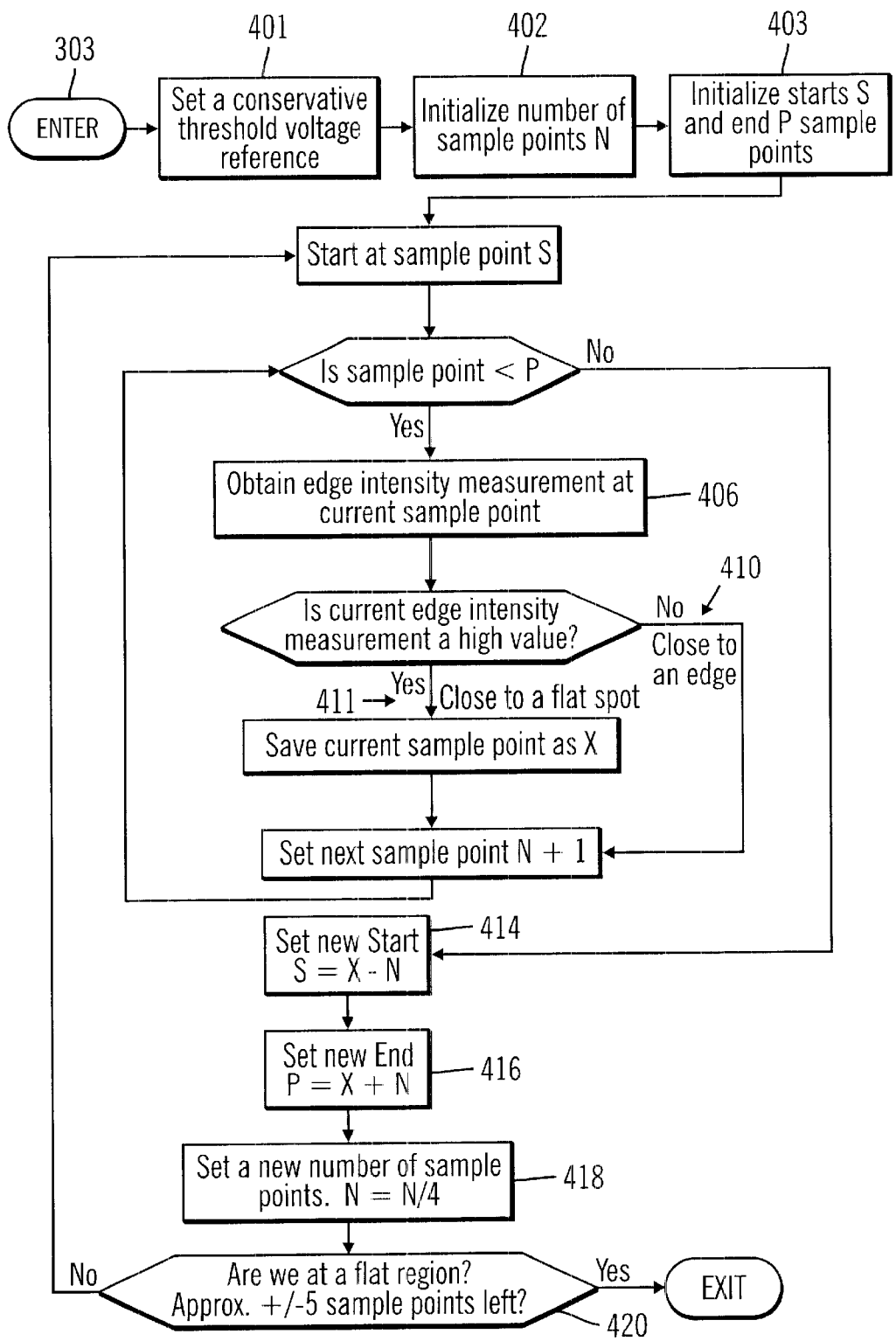
Figure 5:
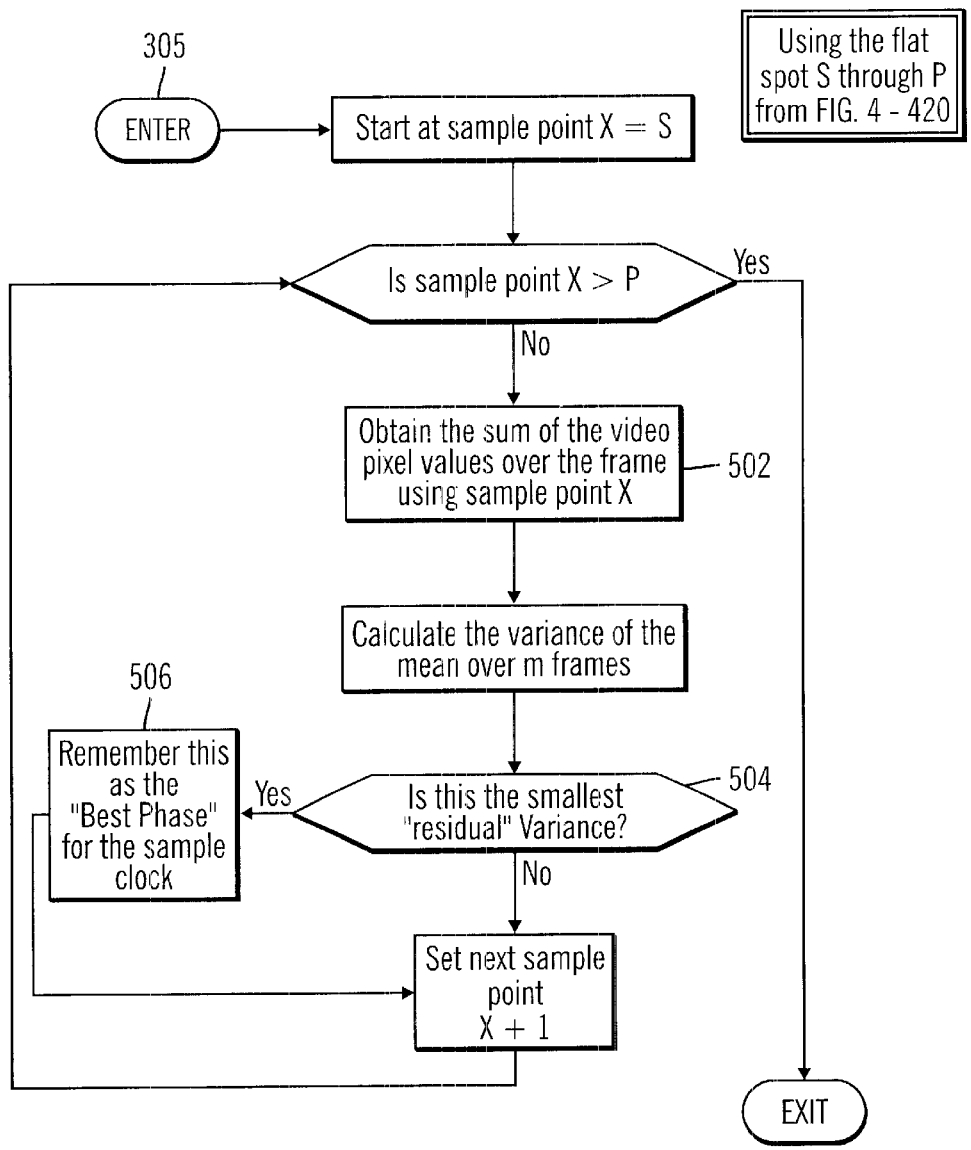

FIGS. 3, 4, and 5, illustrate a new and novel method for sampling voltage levels to determine the best sampling point in the flat region of the bit, according to the preferred embodiments of the present invention. In the present example, the reconstruction controller 110 and phase adjuster 113 follow the new method as will be discussed in detail below. The phase adjuster 113 controls the phase of the pixel clock sampling signal 116 that drives the ADC 112 to sample the ADC 112 during the best portions D 146 and E 148 of the flat region of the bits in the video signal.

According to a preferred method, as shown in FIG. 3, there are two main steps to find the flat spot. After entering the sampling clock phase adjustment mode, at step 302, the controller 110 proceeds to find, at step 303, the sample points that are not in the steep edges in an electronic signal being sampled by the ADC 112. After finding the flat region sample points, i.e., that are away from the edges, the controller 110 proceeds to find, at step 305, the least "noisy" sample points from the flat region sample points found in the previous step 303. In addition to synchronous noise, ringing, pre-shoot, and overshoot are detected as "noise" on the flat spot. After these two steps are successfully completed, the controller 110 then adjusts the sampling clock signal to match the phase of a least noisy flat region sample point. This will sample the analog signal at the best location in the flat region to reliably capture a digital representation of the electronic signals. This is a significant advantage of the present invention not found in any known prior art system and method. The following discussion, with particular reference to FIGS. 4 and 5, will illustrate exemplary sub-steps followed within the two main steps 303, 305, discussed above.

At the first main step 303, the controller 110 finds the sample points that are off of the steep edge of a large signal transition. The controller 110 enters a process for searching sample points that are in the flat region of the electronic signal. The process finds these sample points by using an edge intensity measurement algorithm, at step 406. This samples and measures the differences between sample points using a comparison voltage threshold set at step 401. The algorithm to gather the edge intensity values will be discussed below. In a video signal, for example, pixel-to-pixel contrast for adjacent pixels can be measured to determine the edges. This measured value is minimal if a sample is taken during the edge transition, at step output 410, and the measured value is a maximum if the sample is taken during the flat region of the electronic signal, at step output 411. It can be concluded that a video signal with sufficient contrasting bit values will produce edge intensity values (as computed using the edge intensity measurement algorithm) fit to a curve that can be interpolated with a few discreet points. The "best" sampling point can be found by performing a gradient search within this curve. An initial set of sample points are used to find an approximation of the flat spot, at steps 402 and 403. Then additional samples, at step 418, are made surrounding the approximate answer, at steps 414 and 416. As soon as a few samples remain, at step 420, a flat region can be concluded.

At the second main step 305, the controller 110 searches through the sample points that were found to be away from the edges (i.e., the high contrast points between pixels in a video signal) to find the "least noisy" sample points. The process, at step 305, uses a noise measurement algorithm, at step 502, as will be discussed below. As illustrated in FIG. 1B, noise signals, such as "ringing" noise 142 and synchronous noise 144, can be included in the flat region of the electronic signal. By filtering out the "residual" variance, at step 504, a noise free spot can be found within the flat region, at step 506. The synchronous noise, for example, may be conductively coupled from other circuits on the same ASIC chip substrate that are also clocked with the ADC sample clock. Sampling during the ringing noise 142 or during the synchronous noise 144, yields inconsistent sample values over time. For example, in a video system, the sampling during noise signals in pixel bits from frame to frame would make the image appear noisy.

The final main step 307 sets the phase of the sampling clock to the "Best Phase" value (one that is away from edges and the least noisy) from the result obtained in FIG. 5, at step 506.

We will briefly discuss the mathematics involved in the new and novel noise measurement algorithm according to the preferred embodiments of the present invention. The algorithm counts on a full precision variance measurement to extract out the variance due to noise only, which is a small amount of variance compared to the variance of the signal itself. In other words, for example in a video system application, by measuring average value of a video frame several times over several frames, the controller 110 can get the variance of the signal. If the underlying image is constant over those frames, the algorithm can subtract out the large magnitude variance of the underlying image. What remains is the residual variance due to noise. This noise variance is of small magnitude when compared to the overall variance. Because the computation is done at full 32-bit precision, it is measurable. The phase point with the lowest variance due to noise is the best overall phase point for sampling the signal.

The controller 110 samples video data from the ADC 112, computes one of a few selected statistical computations on the data, and sends the results to the phase adjuster 113. The phase adjuster 113 uses this data to adjust the ADC sampling signal clock phase.

The controller 110 measures video data edge intensity and noise to assist in determining the best phase choice for sampling the bits within a video signal. A good phase selection, away from ADC signal transitions, will result in higher edge intensities, by maximizing the sampled delta in video data. On the other hand, a phase choice near the ADC signal transition will result in lower edge intensities, and amplified noise. Another effect that influences phase selection is the possible presence of synchronous noise during the sample—a noisy part of the flat region. By measuring the noise, phase selections that are roughly equivalent from an edge intensity standpoint (sampling the same flat spot), can be distinguished from each other by noise content.

Summary of the Main Functions in a Video System Application

Edge intensity measurement over a selected area

Noise measurement over a selected area

Summary of Algorithm Descriptions

The edge intensity measurement is done with a sum of the absolute value of the delta between adjacent pixels. A programmable threshold is applied to zero out noise and to amplify edges. Equation:

delta_val=abs(pixel*A*–pixel*B*)–threshold; if (delta_val<0) delta_val=0; sum+=delta_val;

The measurement includes the transition between active data and horizontal blanking data (zero) at the beginning and end of a row of pixel data. The threshold values categorize a transition as an edge or not and zeros out contributions from non-edges. This zeroing out function reduces or eliminates transition energy due to small amplitude noise while isolating and amplifying large amplitude transition energy due to pixel level transitions. The output at the end of the measurement is, for example, a 32-bit number.

The noise measurement is done indirectly by summing the value of all pixels in an area, which gives a scaled mean pixel value. The variance of this mean computed over several frames (in a memory coupled to the controller 110) is a measure of the noise contribution to the signal. For a static video source image, the mean will stay constant, and the variance value of any given frame will be dominated by pixel transitions around the mean rather than noise. However, the variance of the mean over several frames (samples) will be due to noise, because the video signal mean and variance stay constant over frames.

To explain the noise variance measurement, first we examine the equation for the mean signal value of the mth frame of N pixels. The sampled signal and noise at pixel (x,y) in frame m are s(m,x,y) and n(m,x,y) respectively. The average pixel value on $$\mu_{sn}(m) = \left(\sum_N s(m, x, y) + n(m, x, y)\right) / N = \mu_s + \sum_N n(m, x, y)/N$$

the static image is $\mu_s$.

The variance of the mean over m frames is calculated with the following equation:

$$\sigma_\mu^2 = \sum_M (\mu_{sn}(m) - \bar{\mu}_{sn})^2$$

For zero-mean gaussian noise with standard deviation $\sigma_n$ and a static video signal over frames (still image), the equation simplifies to the variance of the mean of M $$\sigma_\mu^2 = \sum_M \left(\mu_s + \sum_N n(m, x, y)/N - \mu_s\right)^2 / M = \sigma_{\mu n}^2 = \sigma_n^2/N$$

samples of N summed random noise sources:

Assuming gaussian noise, the sum of N gaussian signal is itself a gaussian signal with variance 1/N times the source variance, so the above equation is a measure of that variance.

The value sampled by the controller 110 is the sum rather than the mean of the video pixel values over the frame. Therefore the result of the variance of mean calculation is the individual pixel noise variance. The absolute value of the noise variance of the mean will be small relative to the mean or the variance. However, by retaining full precision of the mean calculation, this low-level variance value can be extracted, which enables one ADC phase setting to be distinguished from another in terms of noise content. The output at the end of the measurement is retained at full precision and, in this example, results in a 32-bit number. At the end of M frames, the noise variance is measured according to the above equation, at some confidence level expressed in a Chi-square distribution with entering values dependent on the value of M and σ. Consequently, by accumulating the pixel values over a frame at high precision, then applying this sum over several frames, the relatively low level noise variance is extracted directly.

The present invention can be realized in hardware, software, or a combination of hardware and software. A controller 110, according to the present invention, can be realized in an integrated circuit, a centralized fashion in one computer system, or in a distributed fashion where different elements are spread across several interconnected computer systems. Any kind of computer system, or other computing apparatus adapted for carrying out the methods described herein, is suited for performing the new and novel methods. A typical combination of hardware and software could be a general purpose computer system, such as a personal computer, with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods. Computer program means or computer program in the present context is defined as any expression, in any language, code or notation, of a set of instructions intended to cause a system having an information processing capability to perform a particular function either directly or after either or both of the following a) conversion to another language, code or notation; b) reproduction in a different material form.

Each computer system may include, one or more computers and at least a computer readable medium allowing a computer to read data, instructions, messages or message packets, and other computer readable information from the computer readable medium. The computer readable medium may include non-volatile memory, such as ROM, Flash memory, Disk drive memory, CD-ROM, and other permanent storage. Additionally, a computer medium may include, for example, volatile storage such as RAM, buffers, cache memory, and network circuits. Furthermore, the computer readable medium may include computer readable information in a transitory state medium such as a network link and/or a network interface, including a wired network or a wireless network, that allow a computer to read such computer readable information. As shown in FIG. 2, and as discussed above, according to the present invention, the controller 110 and the phase adjuster 113, preferably comprise a computer system that includes the computer and computer readable medium as discussed above.

The present invention offers significant advantages over the prior art. In prior art systems, the data sampling was handled simply to avoid steep edges of a signal and by attempting to sample just prior to the trailing edge transition where the signal voltage has been assumed to be most stable. Also, there have been no good methods of handling the synchronous noise sources (in other words, finding and avoiding the phases where synchronous noise is present). The sampling system according to the preferred embodiments of the present invention, on the other hand, avoids edges and avoids noisy portions of the flat region. This results in significantly improved performance for devices incorporating the present invention.

Although specific embodiments of the invention have been disclosed, it will be understood by those having ordinary skill in the art that changes can be made to the specific embodiments without departing from the spirit and scope of the invention. Additionally, many modifications may be made to adapt a particular situation to the teachings of the present invention without departing from the central inventive concepts described herein. Furthermore, an embodiment of the present invention may not include all of the features described above. The scope of the invention is not to be restricted, therefore, to the specific embodiments, and it is intended that the appended claims cover any and all such applications, modifications, and embodiments within the scope of the present invention.

What is claimed is:

1. A method comprising the steps of:
   (a) sampling an electronic signal by comparing the electronic signal relative to a reference voltage signal to provide digital representations of the electronic signal at occurrences of a sampling clock signal;
   (b) determining a phase for the sampling clock signal where sampling of the electronic signal at the occurrences of the sampling clock signal is away from edges of the electronic signal;
   (c) determining a phase for the sampling clock signal where sampling of the electronic signal at the occurrences of the sampling clock signal is away from noise signals included in the electronic signal; and
   (d) selecting a phase for the sampling clock signal that is determined to be both away from the edges of the electronic signal and away from noise signals included in the electronic signal.

2. The method of claim 1, wherein the electronic signal is a video signal.

3. The method of claim 1, wherein step (b) includes the step of monitoring a history of digital representations of the electronic signal at selected phases of the sampling clock signal and at varying voltage levels of the reference voltage signal to find a phase for the sampling clock signal that is away from the edges of the electronic signal.

4. The method of claim 1, wherein step (c) includes the step of monitoring a history of digital representations of the electronic signal at selected phases of the sampling clock signal and calculating an average value, a large variance, and a small variance, for the electronic signal at the selected phases of the sampling clock signal, and finding a phase for the sampling clock signal that is away from the noise signals by finding a phase where the small variance for the electronic signal is determined a minimum as compared to the small variance of all the selected phases of the sampling clock signal.

5. An electronic signal sampling system comprising:
   an input for receiving an electronic signal;
   a controllable clock source for providing a sampling clock signal;
   a controllable voltage source for providing a reference voltage signal;
   an analog-to-digital converter, electrically coupled to the input, to the controllable clock source, and to the controllable voltage source, and responsive to the sampling clock signal, for comparing the electronic signal relative to the reference voltage signal to provide digital representations of the electronic signal at occurrences of the sampling clock signal;
   an edge sensor for sensing edges of the electronic signal;
   a noise sensor for sensing noise signals included in the electronic signal; and a controller, coupled to the controllable clock source, the controllable voltage source, the edge sensor, the noise sensor, and the analog-to-digital converter, for adjusting the level of the reference voltage signal and adjusting the phase of the sampling clock signal for finding a voltage level for the reference voltage signal and a phase for the sampling clock signal for comparing the electronic signal to the reference voltage signal at a phase of the sampling clock signal to provide digital representations of the electronic signal at occurrences of the sampling clock signal that are away from an edge of the electronic signal and away from noise signals included in the electronic signal.

6. The electronic signal sampling system of claim 5, wherein the edge sensor senses edges of the electronic signal by monitoring a history of digital representations of the electronic signal at selected phases of the sampling clock signal and at varying voltage levels of the reference voltage signal.

7. The electronic signal sampling system of claim 5, wherein the noise sensor senses noise signals included in the electronic signal by monitoring a history of digital representations of the electronic signal at selected phases of the sampling clock signal and calculating an average value, a large variance, and a small variance, for the electronic signal at the selected phases of the sampling clock signal, and wherein the noise sensor finds a phase for the sampling clock signal that is away from the noise signals by finding a phase where the small variance for the electronic signal is determined a minimum as compared to all the selected phases of the sampling clock signal.

8. The electronic signal sampling system of claim 5, wherein the electronic signal is an analog video signal.

9. A computer readable medium containing computer instructions for a controller to control sampling of an electronic signal as follows:

(a) sampling an electronic signal by comparing the electronic signal relative to a reference voltage signal to provide digital representations of the electronic signal at occurrences of a sampling clock signal;

(b) determining a phase for the sampling clock signal where sampling of the electronic signal at the occurrences of the sampling clock signal is away from edges of the electronic signal;

(c) determining a phase for the sampling clock signal where sampling of the electronic signal at the occurrences of the sampling clock signal is away from noise signals included in the electronic signal; and (d) selecting a phase for the sampling clock signal that is determined to be both away from the edges of the electronic signal and away from noise signals included in the electronic signal.

10. The computer readable medium of claim 9, wherein the electronic signal is a video signal.

11. The computer readable medium of claim 9, wherein step (b) includes the step of monitoring a history of digital representations of the electronic signal at selected phases of the sampling clock signal and at varying voltage levels of the reference voltage signal to find a phase for the sampling clock signal that is away from the edges of the electronic signal.

12. The method of claim 9, wherein step (c) includes the step of monitoring a history of digital representations of the electronic signal at selected phases of the sampling clock signal and calculating an average value, a large variance, and a small variance, for the electronic signal at the selected phases of the sampling clock signal, and finding a phase for the sampling clock signal that is away from the noise signals by finding a phase where the small variance for the electronic signal is determined a minimum as compared to the small variance of all the selected phases of the sampling clock signal.

* * * * *